United States Patent [19]
Ohmura et al.

[11] Patent Number: 4,566,841
[45] Date of Patent: Jan. 28, 1986

[54] WAFERY WORKS RECEIVING OR DELIVERING DEVICE

[76] Inventors: Kenji Ohmura; Tsutomu Miyata; Yoshihiro Yamashita; Minoru Noda, all of 31-1, Kameido 6-chome, Koto-Ku, Tokyo, Japan

[21] Appl. No.: 556,293

[22] Filed: Nov. 30, 1983

[30] Foreign Application Priority Data

Dec. 1, 1982 [JP] Japan .................... 57-210974

[51] Int. Cl.[4] ........................... B65G 65/34
[52] U.S. Cl. ......................... 414/417; 414/609
[58] Field of Search ........... 414/217, 222, 404, 416, 414/417, 609

[56] References Cited

U.S. PATENT DOCUMENTS 4,439,146 3/1984 Sugita ..................... 414/404 X

Primary Examiner—Robert G. Sheridan
Attorney, Agent, or Firm—Robert E. Burns; Emmanuel J. Lobato; Bruce L. Adams

[57] ABSTRACT

Wafery works receiving or delivering device comprise a work supporting means having plural pairs of supporting grooves of a given pitch in order to support a column of wafery works; a transfer mechanism having the work supporting means mounted at the upper end thereof and reciprocatable between a stand-by position and a work receiving or delivering position; a pair of forks disposed in the region of the work receiving or delivering position and having supporting grooves of the same pitch as those of the work supporting means; a fork advancing mechanism such that for advancing the forks to the work receiving or delivering position such that the forks overlap the work supporting means and the supporting grooves thereof align with those of the work supporting means; and a mechanism which collectively hands over the works supported on the work supporting means or on the forks to the forks or the work supporting means by moving the work supporting means upward or downward relative to the forks.

5 Claims, 3 Drawing Figures

WAFERY WORKS RECEIVING OR DELIVERING DEVICE

BACKGROUND OF THE INVENTION

The present invention relates to a wafery work receiving or delivering device suitable for collectively receiving or delivering a large number of wafery works such as silicon wafers.

In order to process the surfaces of silicon wafers, for example, by spattering, etching, etc., it is necessary to use a vacuum chamber. If unprocessed or processed wafers are put in to and out of the vacuum chamber in each process, not only does the vacuum within the chamber become deteriorated, but the chamber also becomes polluted by the entrance of dust particles from outdoors. In the past, silicon wafers were transferred to working positions in lying postures with the surfaces to be worked facing upward because this is the most stable position. Accordingly, two methods have been considered in the collective transfer of wafers in lying positions, that is, they can be tranferred in to or out of the vacuum chamber in transversely aligned relation on a jig plate or in a vertically piled relation with predetermined distances. However, in the former, the volume of the vacuum chamber must be enlarged because the area of one wafer is large and this lowers the volume effect, whereas in the latter, a complicated chucking mechanism is necessary for the reception or delivery of the wafers in the chamber.

Moreover, in transferring the wafers in a lying position, there is a great tendency for dust particles to adhere to their surfaces and for a slight eccentric load to be applied on the wafers which produces bending or internal stress processes, that adversely affect the subsequent fabrication of high density transistors and lowers the production yield.

The present invention aims to eliminate the above-mentioned drawbacks and has as an object to provide a receiving or delivering device suitable for wafery works, such as silicon wafers, which are advantageously transferred in erect positions.

To achieve the above object, the device according to this invention comprises a work supporting means which has plural pairs of supporting grooves of a given pitch in order to support many wafering works in a column and which moves up and down between a stand-by position and a receiving or delivering position, and a pair of forks having supporting grooves of the same pitch as that of the work supporting means, characterized in that the work supporting means and the forks overlap each other so that the works supported on the work supporting means or on the forks can be collectively handed over to the forks or the work supporting means by the relative movement between them.

DETAILED DESCRIPTION OF THE INVENTION

Figure 1:
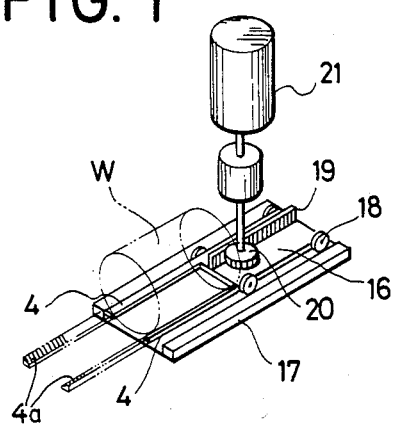
FIG. 1 is an exploded perspective view of the work receiving or delivering device according to this invention.
Figure 1:
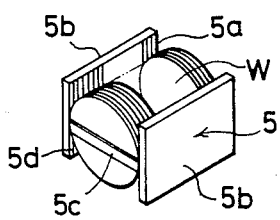
Figure 1:
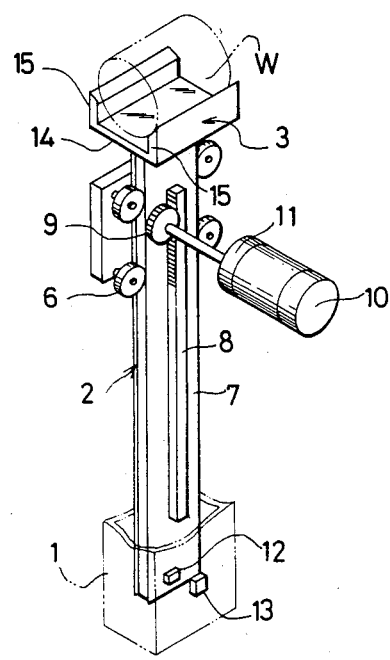

FIG. 1 shows the receiving or delivering device for silicon wafers to which this invention is applied. This device comprises a sealed casing 1 mounted on and through the lower portion of a work supplying station or a work discharging station in the vacuum chamber (not shown), an elevator 2 vertically movable in the sealed casing 1, a work supporting means or wafer holder 3 fixed at the upper end of the elevator 2, a pair of forks 4 which advance or retreat in a direction perpendicular to the movement of the elevator 2, and a work cassette 5 which is supplied in an auxiliary chamber (not shown) formed in the vacuum chamber and to the intermediate position between the receiving or delivering position and the wafer holder 3 when the elevator 2 is at the stand-by position or lowest position.

The work cassette 5 comprises a pair of supporting plates 5b connected to each other by a pair of connecting bars 5c (only one appears in the figure), the supporting plates 5b having a large number of grooves 5a of a given pitch to support many discoidal silicon wafers therein, and the width of each groove 5a is a little larger than the thickness of a work W. To prevent the works from falling down through the cassette 5, stoppers 5d are provided on the supporting plates 5b, respectively. Accordingly, the works are supported in upright positions and make contact with the stoppers 5d at two lower peripheral points.

The work cassette 5 is put in the auxiliary chamber divided by a parting plate inside of the vacuum chamber, the parting plate being shut, then it is automatically fed to the intermediate poition discribed-above by shutting the front flap of the auxiliary chamber. On the other hand, the cassette 5 in the auxiliary chamber is automatically advanced toward the flap by opening the flap so that the cassette can be taken out, and at this time the parting plate is shut. This disposition of the vacuum chamber can maintain the vacuum when the cassette is put in to or out of the chamber.

The elevator 2 is composed of a movable plate 7 being guided by a guide roller 6, a rack 8 mounted on the movable plate 7 in parallel thereto, a pinion 9 which engages with the rack 8, a motor 10 for driving the pinion 9, a detecting mechanism 11 containing an encoder, a photosensor, etc., mounted at an end of the motor 10, a magnet 12 fixed at the lower end of the movable plate 7 and a magnet sensor 13 which is fixed facing the magnet 12 on an outer side of the sealed casing 1 for detecting the highest and lowest positions (only the magnet sensor for the lowest position is shown in the figure).

The wafer holder 3 comprises a base plate 14 horizontally fixed to the upper surface of the movable plate 7 and a pair of supporting side plates 15 projecting upward from the base plate 14.

Figure 2A:
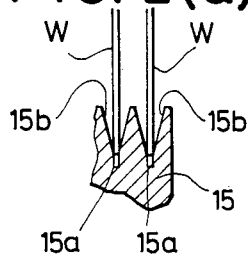
FIGS. 2a and 2b are enlarged partial views of the supporting grooves of the wafer holder, respectively showing in section and in front.
Figure 2B:
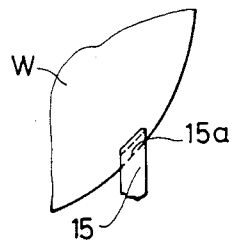

Each supporting plate 15 has an inwardly inclined top end and supporting grooves 15a of the same number and pitch as the grooves 5a of the supporting plate 5b of the cassette 5. FIGS. 2a and 2b are enlarged views of the supporting grooves 15a whose width is slightly larger than the thickness of a work and at the upper portion of which are formed guide portions 15b. The space between the supporting plates 15 is smaller than the inner width of the work cassette 5.

The forks 4 are united with a plate 16 which is mounted to undergo sliding forward and backward movements by means of guide rollers 18 on a base plate 17 supporting the plate 16. On the plate 16 is fixed a rack 19 with which a pinion 20 engages, the pinion being driven by a motor 21 with a built-in encoder.

The forks 4 have an inwardly inclined end and supporting grooves 4a the number and pitch of which are the same as those of the work cassette 5 or the wafer holder 3. The space between the forks 4 is smaller than the inner width of the wafer holder 3.

A description will now be given as to how the works W held in the work cassette 5 are handed over to the forks 4.

First, when the elevator 2 is at the stand-by position or lowest position and the forks 4 are fully retreated, the work cassette 5 holding the works W is supplied in the auxiliary chamber to the fixed position.

Next, the rotation of the motor 10 moves the movable plate 7 upward, and when the wafer holder 3 passes the cassette 5, the works W held in the cassette 5 are collectively handed over to the wafer holder 3. The holder 3 continues ascending until the base plate 14 is located beneath the level of the under surfaces of the forks 4 when in the advanced position. At this time, of course, the forks 4 are in the retreated position.

As soon as the elevator stops, the motor 21 drives the forks 4 to advance until they penetrate into the space formed between the wafer holder 3 and the works W therein, and the supporting grooves of the forks 4 correspond and align with those of the supporting plates 15.

After the forks 4 reach their advanced position, the elevator 2 moves down by the reverse rotation of the motor 10, delivering or transferring the works held in the holder 3 to the forks 4, and the elevator stops at the stand-by position or lowest position.

Then the forks 4 supporting the works W thereon retreat pitch by pitch to a retreated position delivering the works one by one to a transfer mechanism (not shown). While this delivery is being made, the empty cassette 5 is taken out from the auxiliary chamber and a new cassette supporting another supply of works W is put in it.

After the works supported on the forks 4 are entirely delivered to the transfer mechanism, the receiving or delivering operation is again repeated.

It is noted that the operation described is for collectively supplying unprocessed works to the receiving position of the work supplying station, but by reversing the operation the works supported on the forks 4 can be collectively filled in an empty cassette. Accordingly, the receiving or delivering device according to this invention can be installed both in the work supplying station and the work discharging station of a work transfer device, without any modification to the essentials of the device, and can collectively transfer many wafery works in upright positions from the stand-by position to the work receiving or delivering transfer position.

This device is suitable for transferring works, such as silicon wafers, that must be worked in a vacuum chamber which must not be frequently opened, and which tend to be contaminated by dust and to undergo local deformation if transferred in a lying position. This device is advantageous in that the volume of the vacuum chamber can be reduced, that there is no need for a complicated mechanism for receiving or delivering works, and that only two point supporting make the device simple and minimize any damage of the surface of the works or any bending resulting from an eccentric load.

Finally, it is understood that the widths of the fork, the work cassette and the wafer holder may be ones that do not relatively interfere with each other.

What is claimed is:

1. Wafery works receiving or delivering device comprising: a work supporting means having plural pairs of opposed supporting grooves of a given pitch dimensioned to support a column of wafery works in erect positions; a transfer mechanism having said work supporting means mounted at the upper end thereof and reciprocable between a standby position and a work receiving or delivering position; a pair of forks located in the region of said work receiving or delivering position and having supporting grooves of the same pitch as that of the supporting grooves of said work supporting means; a fork advancing mechanism for advancing said forks to said work receiving or delivering position to enable said forks to overlap said work supporting means such that the supporting grooves of said forks align with those of said work supporting means; and means for collectively transferring the works supported in erect positions on said work supporting means to said forks or for collectively transferring the works supported in erect positions on said forks to said work supporting means in response to movement of said work supporting means into and out of said work receiving or delivering position.

2. A device for transferring discoidal works while maintaining the works in erect positions comprising: movable work holding means having a row of plural pairs of spaced-apart opposed supporting grooves of a given pitch for supporting a row of discoidal works in erect positions such that each pair of grooves supports one work; actuating means for moving the work holding means between a stand-by position and a transfer position; a pair of movable forks each having a row of supporting grooves therealong with the supporting grooves of both forks defining a row of plural pairs of opposed supporting grooves of the same pitch as said given pitch for supporting a row of discoidal works in erect positions such that each pair of grooves supports one work; and fork actuating means for moving the forks in one direction to an advanced position in which the forks overlap the work holding means when the same is in the transfer position such that the supporting grooves of the forks align with those of the work holding means to effect a transfer of works therebetween while maintaining the works in erect positions in response to subsequent movement of the work holding means toward the stand-by position, and for moving the forks in the opposite direction to a retreated position.

3. A device according to claim 2; wherein the holding means comprises a pair of spaced-apart opposed side plates having the row of plural pairs of supporting grooves formed on their opposed facing surfaces.

4. A device according to claim 3; wherein the forks are spaced apart a distance less than the distance between the pair of side plates to enable the forks to move between the side plates when moving to the advanced position.

5. A device according to claim 2; wherein the work holding means includes a base plate connected to the bottoms of the side plates and defining therewith a work holder.

* * * * *